United States Patent
Hirata

[11] Patent Number: 5,820,810
[45] Date of Patent: Oct. 13, 1998

[54] METHOD OF FORMING FINE CERAMICS STRUCTURE

[75] Inventor: Yoshihiro Hirata, Osaka, Japan

[73] Assignee: Sumitomo Electric Industries, Ltd., Osaka, Japan

[21] Appl. No.: 918,512

[22] Filed: Aug. 22, 1997

Related U.S. Application Data

[62] Division of Ser. No. 531,158, Sep. 19, 1995, Pat. No. 5,676,906.

[30] Foreign Application Priority Data

Sep. 28, 1994 [JP] Japan .................................. 6-232825

[51] Int. Cl.$^6$ ............................. B29C 33/40; B29C 33/76
[52] U.S. Cl. ........................ 264/400; 264/219; 264/225; 264/317
[58] Field of Search .................................. 264/219, 225, 264/317, 400

[56] References Cited

U.S. PATENT DOCUMENTS

| | | | |
|---|---|---|---|
| 3,836,372 | 9/1974 | Horton | 106/38.22 |
| 4,109,699 | 8/1978 | Miller et al. | 164/244 |
| 4,808,360 | 2/1989 | Natori et al. | |
| 4,889,666 | 12/1989 | Kawasaki | |
| 4,975,225 | 12/1990 | Vivaldi et al. | |
| 5,164,920 | 11/1992 | Bast et al. | |
| 5,385,700 | 1/1995 | Denton | |
| 5,676,906 | 10/1997 | Hirata | 264/430 |

FOREIGN PATENT DOCUMENTS

| | | |
|---|---|---|
| 0464224 | 1/1992 | European Pat. Off. |
| 3725500 | 2/1989 | Germany |
| 4338433 | 6/1994 | Germany |
| 4-232425 | 8/1992 | Japan |

OTHER PUBLICATIONS

G. Preu, A. Wolff, D. Cramer, and U. Bast; "Microstructuring of Piezoelectric Ceramic", Proceedings of the Second European Ceramic Society Conference, 1991, pp. 2005–2009.

W.A. Smith; "New opportunities in ultrasonic transducers emerging from innovations in piezoelectric materials", SPIE vol. 1733 (1992), pp. 3–26.

A. Rogner, J. Eicher, D. Münchmeyer, R–P Peters and J. Mohr, "The LIGA technique–what are the new opportunities", Journal of Micromechanics and Microengineering, No. 2, 1992, pp. 133–140.

*Primary Examiner*—Christopher A. Fiorilla
*Attorney, Agent, or Firm*—W. F. Fasse; W. G. Fasse

[57] ABSTRACT

A method of forming a fine ceramics structure having columns with a fine pattern of width and a high aspect ratio includes steps of charging a plastic mold with a ceramics slurry, solidifying the ceramics slurry, and thereafter removing the plastic mold. The plastic mold is removed by heating the plastic mold in a vacuum, employing laser ablation, employing plasma etching, or employing a solvent of low viscosity dissolving plastic mold. Especially, the plastic mold is made of acrylic, the ceramics structure is made of lead zirconate titanate, and the mold is removed by laser ablation. The resulting fine pattern ceramics structure may have columns with an aspect ratio of at least 10, and particularly a height of 100 μm and a diameter of 10 μm.

17 Claims, 5 Drawing Sheets

METHOD OF FORMING FINE CERAMICS STRUCTURE

CROSS-REFERENCE TO RELATED APPLICATION

This application is a divisional of our commonly assigned application U.S. Ser. No. 08/531,158, filed on Sep. 19, 1995, now U.S. Pat. No. 5,676,906.

BACKGROUND OF THE INVENTION

1. Field of the Invention

The present invention relates to a method of forming a fine ceramics structure, and especially fine piezoelectric ceramics columns which are necessary for a medical ultrasonic oscillator or sonar.

2. Description of the Background Art

In general, a lost wax process is employed as one of methods for forming fine ceramics structures. This process is now described with reference to FIG. 6.

Referring to FIG. 6, a substrate 2 coated with a resist material 1 which is sensitive to X-rays is irradiated with synchrotron radiation (SR) through a mask 3 to be subjected to deep X-ray lithography, and thereafter developed to prepare resist structures 4 (see (1) in FIG. 6).

Then, a mold 5 is formed by electroforming the resist structures 4, which in turn are thereafter removed (see (2) in FIG. 6).

Then, the mold 5 which is formed in the aforementioned manner is employed to carry out plastic molding, thereby preparing a plastic mold 6 (see (3) in FIG. 6). This plastic mold 6 has an inverted shape of a desired fine ceramics structure.

Then, the plastic mold 6 is charged with a ceramic slurry 7, which in turn is dried and solidified (see (4) in FIG. 6).

Finally, the plastic mold 6 is baked away by heat to leave only the ceramics, which in turn is fired to prepare a fine ceramics structure 8 (see (5) in FIG. 6).

According to the aforementioned conventional method, it is possible to form a fine ceramic structure having depressions such as holes or grooves of at least 100 μm in width, for example.

In the conventional method, however, it is extremely difficult to form a fine ceramics structure having columns in a fine pattern of not more than 100 μm width a high aspect ratio.

SUMMARY OF THE INVENTION

In order to solve the aforementioned problem, an object of the present invention is to provide a method of forming a fine ceramics structure having columns with a fine pattern of width and a high aspect ratio.

According to one aspect of the present invention, a method of forming a fine ceramics structure is provided.

This method is adapted to form a fine ceramics structure by charging a plastic mold with a ceramics slurry, solidifying the ceramics slurry and thereafter removing the plastic mold. For removing the plastic mold, any of a method of heating the plastic mold in vacuum, a method employing laser ablation, a method employing plasma etching, and a method of employing a solvent of low viscosity for dissolving the plastic mold is employed. Especially according to the present invention, plasma etching is used to remove the mold.

When the method of heating the plastic mold in a vacuum is employed for removing the plastic mold, the plastic mold is preferably made of acrylic resin.

When laser ablation is employed for removing the plastic mold, it is preferable that the plastic mold is made of acrylic resin, the fine ceramics structure is made of lead zirconate titanate, and the laser ablation is carried out by irradiating the plastic mold with a laser beam at an energy density of not more than 350 mJ/cm$^2$.

When plasma etching is employed for removing the plastic mold, it is preferable that the plastic mold is made of acrylic resin, and the fine ceramics structure is made of lead zirconate titanate.

When a solvent of low viscosity dissolving the plastic mold is employed for removing the plastic mold, it is preferable that the plastic mold is made of acrylic resin and the solvent is acetone.

The inventors have carried out deep study in order to solve the aforementioned problem, to discover that the difficulty in formation of a fine ceramics structure having fine columns of a high aspect ratio has been generally caused by employment of thermal decomposition for removal of the plastic mold.

It is conceivable that the resin, which is melted in the thermal decomposition and flows as a viscous fluid, disadvantageously pushes down columnar projections of the fine ceramics structure. When a column having a square section is placed in a fluid flowing at a certain flow velocity, for example, its viscosity resistance is proportional to $\mu v(h/L)/L$, where v represents the flow velocity, $\mu$ represents the coefficient of viscosity, L represents the length of each side of the square, and h represents the height. Namely, the viscosity is directly proportional to the coefficient of viscosity ($\mu$) and the aspect ratio (h/L), and inversely proportional to the length (L) of each side. Therefore, the columnar projections etc. of the fine ceramics structure easily fall, i.e., are pushed down, as the pattern width is refined and the aspect ratio (h/L) is increased.

According to the present invention, therefore, the plastic mold is removed by any one of heating the plastic mold in a vacuum, laser ablation, plasma etching and dissolution with a solvent.

Thus, the resin is not melted to flow for removal of the plastic mold, whereby columnar projections etc. of the ceramics structure are not broken.

Consequently, it is possible to form a fine ceramics structure having columns with a fine pattern of width and a high aspect ratio.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
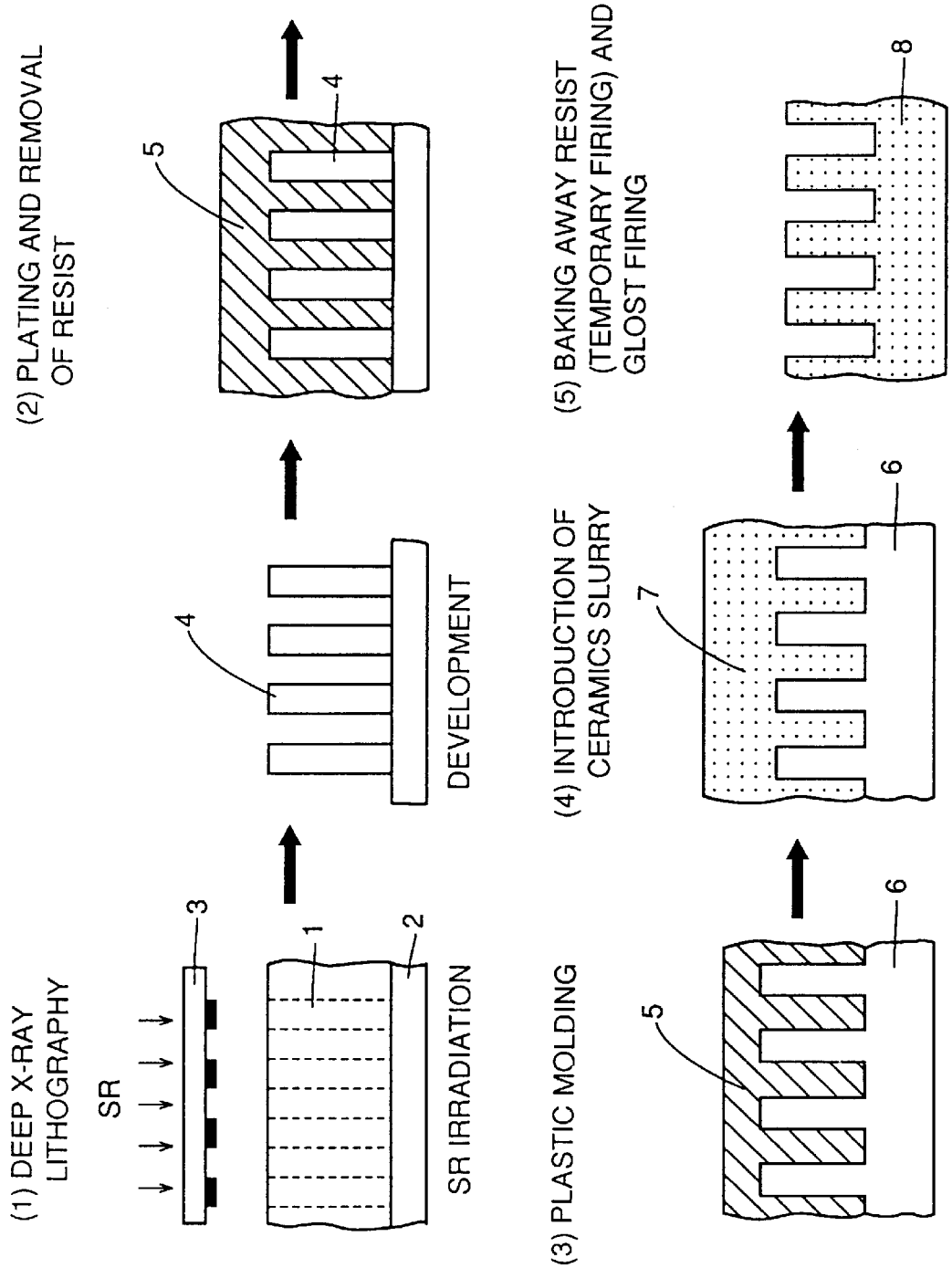
FIG. 6 is a sectional view showing an example of a conventional method of forming a ceramics structure.

First, a ceramic slurry was charged in a plastic mold and solidified as follows, similarly to the conventional method shown at (1) to (4) in FIG. 6:

First, a conductive substrate 2 coated with a resist material 1 which was sensitive to X-rays was subjected to lithography with synchrotron radiation (SR) through an X-ray lithography mask 3 having a support film of silicon nitride of 2 $\mu$m in thickness for example and a relatively thick absorbent pattern of tungsten of 5 $\mu$m in thickness for example, as shown at (1) in FIG. 6. Thereafter the substrate 2 was developed to prepare resist structures 4.

Then, the prepared resist structures 4 were nickel-plated to prepare a nickel mold 5 as shown at (2) in FIG. 6, and thereafter removed.

Then, the nickel mold 5 was employed to carry out plastic molding, thereby preparing a plastic mold 6 as shown at (3) in FIG. 6. This plastic mold 6 was in an inverted shape of a fine ceramics structure having columns of 10 $\mu$m$\phi$ at a height of 100 $\mu$m. Alternatively, a substrate may be formed by a resist plate or an acrylic resin plate to be coated with a resist material, subjected to lithography with SR and developed, for preparing a plastic mold.

Then, the plastic mold 6 was charged with a ceramic slurry 7, which in turn was dried and solidified, as shown at (4) in FIG. 6.

Finally, the plastic mold 6 was removed by any one of the following four methods in accordance with the present invention followed by firing, thereby forming a fine ceramics structure 8.

(1) Method by Heating in Vacuum

Figure 1:
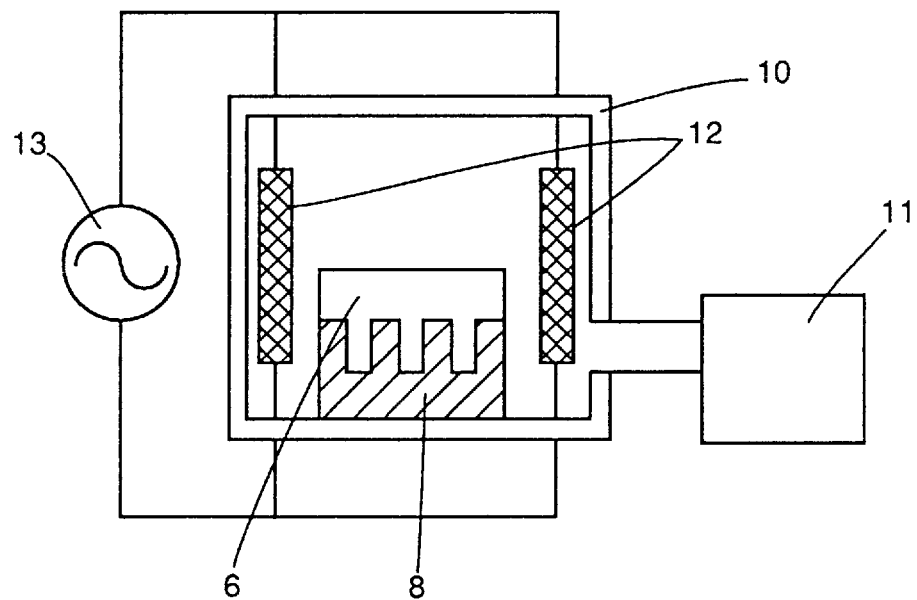
FIG. 1 schematically illustrates an exemplary apparatus for removing a plastic mold by heating the same in a vacuum in accordance with the present invention.

FIG. 1 illustrates an exemplary apparatus of removing a plastic mold by heating the same in vacuum in accordance with the present invention.

Referring to FIG. 1, this apparatus is formed by a vacuum vessel 10, a pump 11 for evacuating the vacuum vessel 10, heaters 12 which are arranged in the vacuum vessel 10, and a power source 13 which is connected with the heaters 12.

The apparatus having the aforementioned structure was employed to remove the plastic mold 6 as follows:

First, the plastic mold 6 in which the ceramic slurry 7 was charged and solidified was arranged in the vacuum vessel 10. Then, thermal decomposition was carried out under conditions of a temperature of not more than 500° C. and a degree of vacuum of not more than $10^{-4}$ Torr.

At this time, the resin of the plastic mold 6 was decomposed and evaporated at extremely higher rates than those in the atmosphere while sublimation was caused when the plastic mold 6 was made of small molecular weight resin, whereby it was possible to remove the plastic mold 6 without exerting force on the fine ceramics structure 8. Consequently, it was possible to form the fine ceramics structure 8 having columnar projections of 10 $\mu$m$\phi$ at a height of 100 $\mu$m.

(2) Method by Laser Ablation

The plastic mold can be removed using laser ablation due to the difference between threshold values of the fine ceramics structure and the plastic mold in relation to ablation. In other words, it is possible to ablate and remove only the plastic mold while leaving the fine ceramics structure undamaged by using a laser power with a value between threshold energy density values of the plastic mold and the ceramics. A concrete example is now described.

Figure 2:
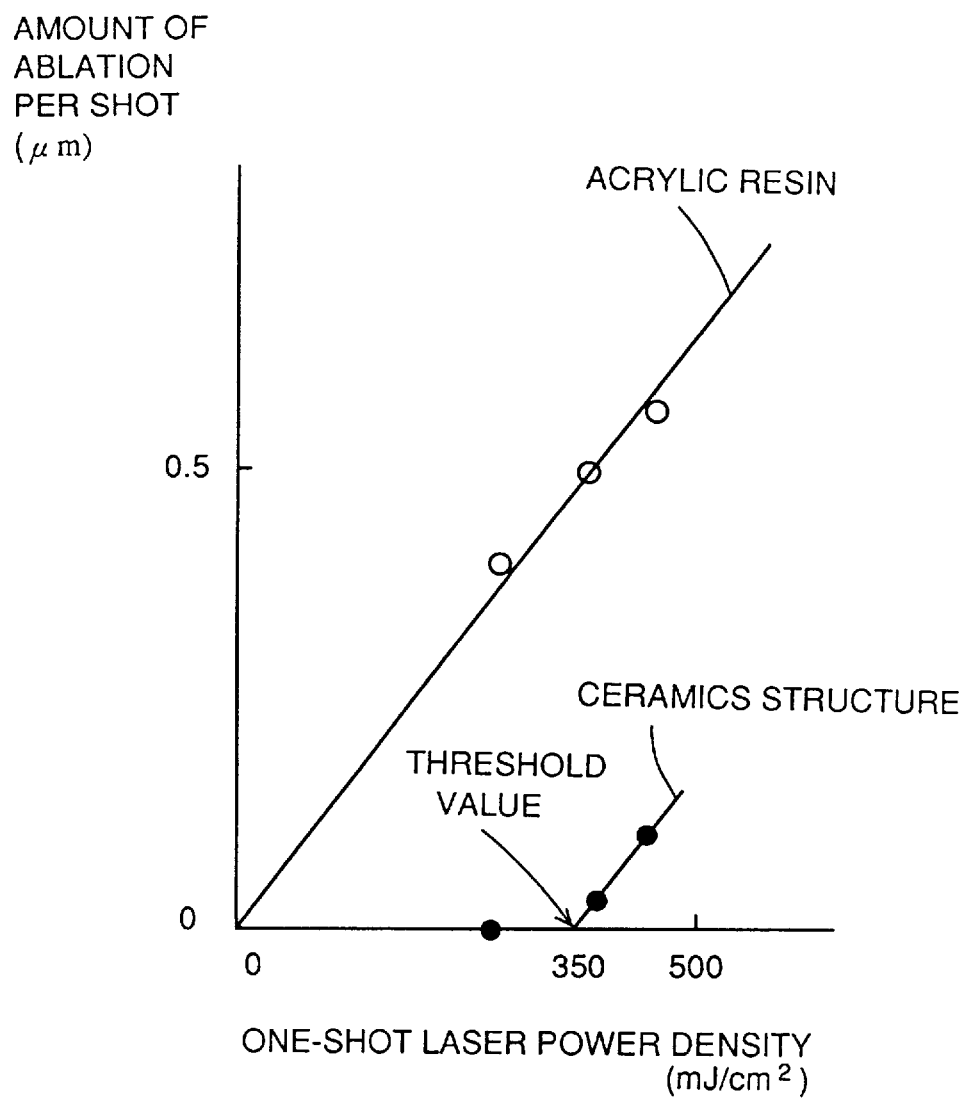
FIG. 2 illustrates the relation between one-shot laser power density and the amount of ablation per shot.

Laser ablation was carried out on a plastic mold of acrylic and a fine ceramics structure of lead zirconate titanate, for example, with an ArF excimer laser beam. FIG. 2 illustrates the relation between one-shot laser power density (mJ/cm$^2$) and the amount of ablation ($\mu$m) per shot.

It was possible to remove only the plastic mold through ablation without exerting an influence on the ceramics structure, by applying the laser beam at an energy density of not more than 350 mJ/cm$^2$, which was the threshold value of ceramics. Consequently, it was possible to form a fine ceramics structure having columnar projections of 10 $\mu$m$\phi$ at a height of 100 $\mu$m.

Figure 3:
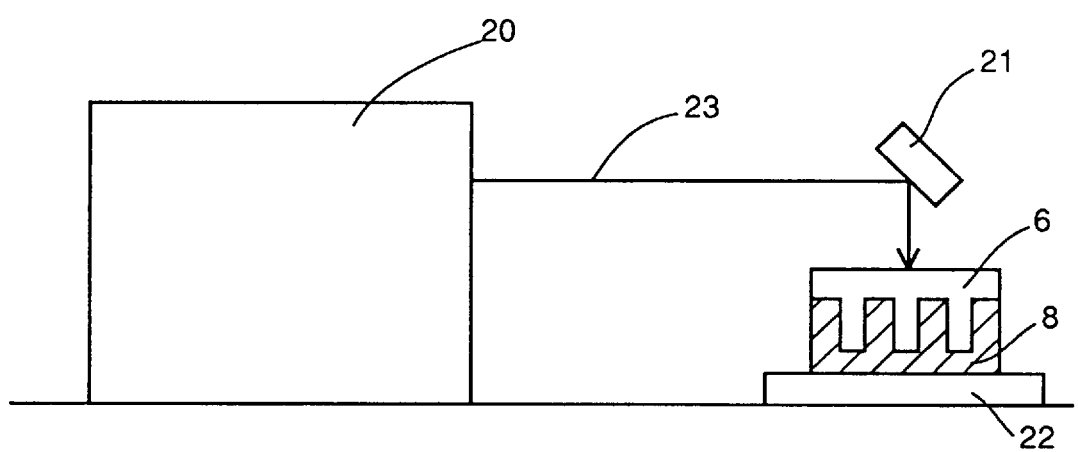
FIG. 3 schematically illustrates an exemplary apparatus for removing a plastic mold by laser ablation in accordance with the present invention.

FIG. 3 schematically illustrates an exemplary apparatus for removing a plastic mold by laser ablation in accordance with the present invention.

Referring to FIG. 3, this apparatus is formed by a laser beam source 20, a mirror 21, and a scanning stage 22 for receiving and moving the plastic mold 6. When it is necessary to remove the plastic mold 6 in a wide area, for example, a laser beam 23 can be applied to only a necessary area through such an apparatus.

(3) Method by Plasma Etching

When etching is carried out with a plasma of oxygen and Freon, for example, resin is decomposed at a high rate while ceramics is etched at a low rate. It is possible to remove the plastic mold by use of a difference in dry etching resistance between the fine ceramics structure and the plastic mold. A concrete example is now described.

Figure 4:
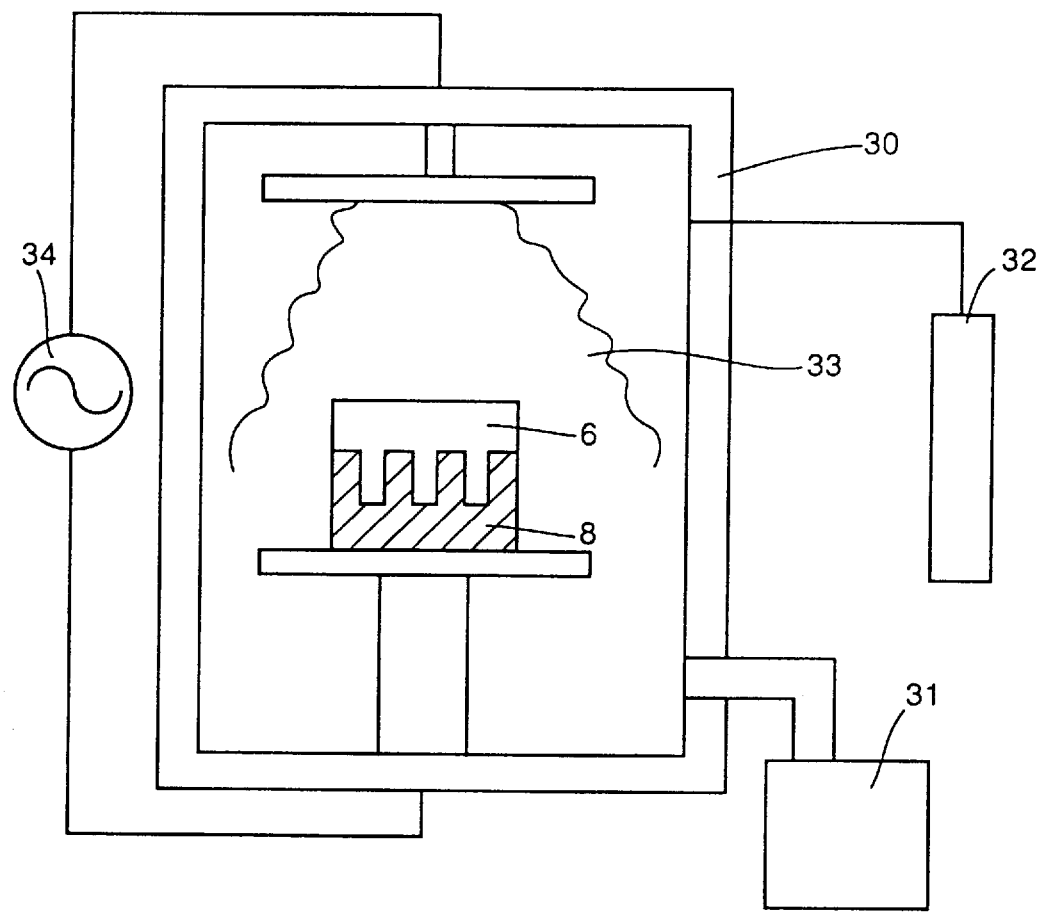
FIG. 4 schematically illustrates an exemplary apparatus for removing a plastic mold by plasma etching in accordance with the present invention.

FIG. 4 schematically illustrates an exemplary apparatus for removing a plastic mold by plasma etching in accordance with the present invention.

Referring to FIG. 4, this apparatus is formed by a vacuum vessel 30, a pump 31 for evacuating the vacuum vessel 30, an etching gas supply source 32 for supplying etching gas into the vacuum vessel 30, and a power source 34 for generating a plasma 33.

When plasma etching was carried out on a plastic mold of acrylic and a fine ceramics structure of lead zirconate titanate with plasma power of 50 W and a reaction gas pressure of 0.5 Torr, for example, the plastic mold of acrylic was etched at about 3 $\mu$m/min. while the fine ceramics structure was not etched. Consequently, it was possible to form a fine ceramics structure having columns of 10 $\mu$m$\phi$ at a height of 100 $\mu$m.

It is important to optimize plasma conditions in response to the shape of the fine ceramics structure as formed, such as the width of and the aspect ratio the columns, for example.

The relation between RF power and the aspect ratio of the ceramics columns was studied as follows:

First, holes were formed in the plastic mold 6 to respectively have different depths of 30, 50, 70, 90, 100, 120, 150, 170, 200, 220 and 250 $\mu$m with a uniform or constant 20 $\mu$m diameter, and then the holes were charged with a ceramics slurry, for preparing samples. These samples were then etched under respective conditions of RF power values of 30, 50 and 100 W, to remove the plastic molds.

Consequently, it has been recognized that high ceramics columns cannot be formed because the columns are broken similarly to the case of thermal decomposition when the RF power is too. Table 1 shows the relation between the RF power and the heights of ceramics columns that can be formed, and shows an aspect ratio of at least 12.5 for a power of at most 30 W.

TABLE 1

| RF Power | Shape of Formable Ceramics Column |
|---|---|
| 30 W | Diameter: 20 µm, Height: 250 µm |
| 50 W | Diameter: 20 µm, Height: 170 µm |
| 100 W | Diameter: 20 µm, Height: 90 µm |

The above experiment was made in relation to heights of up to 250 µm, and hence the maximum possible upper limit of the height of the ceramics columns achievable in the case of 30 W RF power was not determined. Formation of higher ceramics columns can be expected in the case of not more than 30 W.

For the purpose of comparison, a plastic mold was prepared from polyimide and subjected to an experiment. The etching rate of this sample was about 1 µm/h. under conditions of RF power of 50 W and a reaction gas pressure of 0.5 Torr. Therefore, a binder contained in the ceramics slurry was carbonized and hence it was impossible to obtain a fine ceramics structure having columns of a high aspect ratio. Thus, it is understood that acrylic is a suitable material for the inventive method due to the high rate of plasma etching of the acrylic.

(4) Method by Dissolution with Solvent

Figure 5:
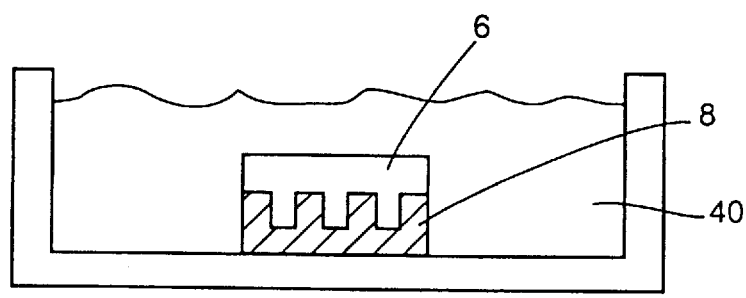
FIG. 5 schematically illustrates a state of removing a plastic mold by dissolution with a solvent in accordance with the present invention.

FIG. 5 schematically illustrates a state of removing a plastic mold by dissolution with a solvent in accordance with the present invention.

Referring to FIG. 5, it is possible to remove only a plastic mold 6, in which a ceramic slurry is charged and solidified, without exerting an influence on a fine ceramics structure 8 by dipping the plastic mold 6 in a solvent 40 of low viscosity for dissolving the resin.

When the solvent 40 was prepared from acetone in relation to the plastic mold 6 of acrylic, only the plastic mold 6 was dissolved while the fine ceramics structure 8 was not dissolved. Consequently, it was possible to form a fine ceramics structure having columns of 10 µmφ at a height of 100 µm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a fine ceramic structure, comprising charging a ceramic slurry into a plastic mold, solidifying said ceramic slurry, and thereafter removing said plastic mold using laser ablation.

2. The method according to claim 1, wherein said plastic mold comprises acrylic resin, said fine ceramic structure comprises lead zirconate titanate, and said laser ablation comprises irradiating said plastic mold with a laser beam having an energy density of not more than 350 mJ/cm².

3. The method according to claim 1, wherein said plastic mold consists essentially of acrylic resin.

4. The method according to claim 3, wherein said fine ceramic structure consists essentially of lead zirconate titanate.

5. The method according to claim 1, wherein said fine ceramic structure consists essentially of lead zirconate titanate.

6. The method according to claim 1, wherein said ceramic slurry is a lead zirconate titanate slurry.

7. The method according to claim 1, further comprising a preliminary step of preparing said plastic mold of acrylic resin, wherein said preliminary step comprises patterning a resist structure with a negative pattern using synchrotron radiation lithography, forming a nickel mold with a positive pattern inversely corresponding to said negative pattern by plating nickel onto said resist structure, and then charging said acrylic resin into said nickel mold to form said plastic mold to have a final mold pattern corresponding to said negative pattern.

8. The method according to claim 1, wherein said fine ceramic structure consists essentially of said solidified ceramic slurry remaining after said plastic mold is removed.

9. The method according to claim 1, further comprising preparing said plastic mold and carrying out said laser ablation so that said fine ceramic structure is formed by said solidified ceramic slurry remaining after said plastic mold is removed and so that said fine ceramic structure includes at least one ceramic column having a height and a width with an aspect ratio of at least 10.

10. The method according to claim 9, wherein said height is at least 100 µm.

11. The method according to claim 1, wherein said plastic mold is prepared and said laser ablation is carried out such that said fine ceramic structure is formed by said solidified ceramic slurry remaining after said mold is removed so that said fine ceramic structure includes at least one ceramic column having a height of at least 100 µm.

12. The method according to claim 1, wherein said laser ablation is carried out so as to ablate and remove only said plastic mold without ablating said solidified ceramic slurry.

13. The method according to claim 1, wherein said laser ablation is carried out using a laser beam having an energy density that is between a first ablation energy density threshold of a plastic material of said plastic mold and a second ablation energy density threshold of said solidified ceramic slurry.

14. The method according to claim 1, wherein said laser ablation is carried out using a laser beam having an energy density greater than a threshold energy density needed to ablate said plastic mold and not more than 350 mJ/cm².

15. The method according to claim 14, wherein said laser beam is a pulsed laser beam, and said energy density of said laser beam is a one shot power density of one pulse of said pulsed laser beam.

16. The method according to claim 15, wherein said laser beam is an ArF excimer laser beam.

17. The method according to claim 1, wherein said laser ablation comprises applying a laser beam to only said plastic mold and not to said solidified ceramic slurry by directing and scanning a laser beam at and along said plastic mold.

* * * * *

UNITED STATES PATENT AND TRADEMARK OFFICE
CERTIFICATE OF CORRECTION

PATENT NO. : 5,820,810

DATED : Oct. 13, 1998

INVENTOR(S) : Hirata

It is certified that error appears in the above-identified patent and that said Letters Patent is hereby corrected as shown below:

Col. 5, line 2, after "too" insert --high--.

Signed and Sealed this

Ninth Day of March, 1999

Attest:

Attesting Officer

Q. TODD DICKINSON

Acting Commissioner of Patents and Trademarks